(12) United States Patent
Chang et al.

(10) Patent No.: US 9,991,205 B2
(45) Date of Patent: Jun. 5, 2018

(54) SEMICONDUCTOR DEVICE AND METHOD

(71) Applicant: Taiwan Semiconductor Manufacturing Company, Ltd., Hsin-Chu (TW)

(72) Inventors: Che-Cheng Chang, New Taipei (TW); Chih-Han Lin, Hsin-Chu (TW); Horng-Huei Tseng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 15/394,003

(22) Filed: Dec. 29, 2016

(65) Prior Publication Data

US 2018/0040559 A1 Feb. 8, 2018

Related U.S. Application Data

(60) Provisional application No. 62/370,583, filed on Aug. 3, 2016, provisional application No. 62/405,737, filed on Oct. 7, 2016.

(51) Int. Cl.
 *H01L 29/76* (2006.01)
 *H01L 29/94* (2006.01)
 (Continued)

(52) U.S. Cl.
 CPC ........ *H01L 23/535* (2013.01); *H01L 21/7684* (2013.01); *H01L 21/76224* (2013.01);
 (Continued)

(58) Field of Classification Search
 CPC .............. H01L 21/7684; H01L 23/535; H01L 29/0653; H01L 29/0847
 (Continued)

(56) References Cited

U.S. PATENT DOCUMENTS 5,965,922 A * 10/1999 Matsui .................. G11C 11/412
257/369
7,667,271 B2 2/2010 Yu et al.
(Continued)

FOREIGN PATENT DOCUMENTS

JP 2008016589 A 1/2008
KR 20060002617 A 1/2006
(Continued)

*Primary Examiner* — David S Blum
(74) *Attorney, Agent, or Firm* — Slater Matsil, LLP

(57) ABSTRACT

A representative method for manufacturing a semiconductor device (e.g., a fin field-effect transistor) includes the steps of depositing a first insulating material over a substrate, and forming a first conductive contact in the first insulating material. The first conductive contact has a protruding uppermost surface, with a first height along a central portion of the first conductive contact, and a second height along a vertical vector projection of a sidewall of the first conductive contact. The first height is larger than the second height. A second insulating material is deposited over the first insulating material, and a second conductive contact is formed in the second insulating material. The second conductive contact is disposed over and at least partially within the first conductive contact. A distance between a bottommost surface of the second conductive contact and the protruding uppermost surface of the first conductive contact is less than about 1.0 nm.

20 Claims, 19 Drawing Sheets

(51) Int. Cl.

| | | |
|---|---|---|
| H01L 31/062 | (2012.01) |
| H01L 31/113 | (2006.01) |
| H01L 31/119 | (2006.01) |
| H01L 23/48 | (2006.01) |
| H01L 23/52 | (2006.01) |
| H01L 29/40 | (2006.01) |
| H01L 21/4763 | (2006.01) |
| H01L 21/302 | (2006.01) |
| H01L 21/461 | (2006.01) |
| H01L 23/535 | (2006.01) |
| H01L 29/06 | (2006.01) |
| H01L 29/08 | (2006.01) |
| H01L 29/78 | (2006.01) |
| H01L 29/161 | (2006.01) |
| H01L 29/165 | (2006.01) |
| H01L 29/20 | (2006.01) |
| H01L 29/267 | (2006.01) |
| H01L 29/66 | (2006.01) |
| H01L 21/762 | (2006.01) |
| H01L 21/768 | (2006.01) |
| H01L 23/532 | (2006.01) |
| H01L 29/49 | (2006.01) |
| H01L 23/528 | (2006.01) |
| H01L 29/45 | (2006.01) |

(52) U.S. Cl.
CPC .. *H01L 21/76804* (2013.01); *H01L 21/76829* (2013.01); *H01L 21/76889* (2013.01); *H01L 21/76895* (2013.01); *H01L 23/5283* (2013.01); *H01L 23/53257* (2013.01); *H01L 29/0653* (2013.01); *H01L 29/0847* (2013.01); *H01L 29/161* (2013.01); *H01L 29/165* (2013.01); *H01L 29/20* (2013.01); *H01L 29/2003* (2013.01); *H01L 29/267* (2013.01); *H01L 29/456* (2013.01); *H01L 29/4991* (2013.01); *H01L 29/66545* (2013.01); *H01L 29/66636* (2013.01); *H01L 29/66795* (2013.01); *H01L 29/7848* (2013.01); *H01L 29/7851* (2013.01)

(58) Field of Classification Search
USPC .......................... 257/384, 751; 438/648, 672
See application file for complete search history.

(56) References Cited

U.S. PATENT DOCUMENTS

| | | | |
|---|---|---|---|
| 7,910,453 B2 | 3/2011 | Xu et al. |
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,536,825 B2 | 1/2017 | You et al. |
| 2005/0263801 A1 | 12/2005 | Park et al. |
| 2008/0014736 A1 | 1/2008 | Kawakita |
| 2009/0227080 A1 | 9/2009 | Jeon |
| 2009/0321942 A1* | 12/2009 | Sell .................. H01L 21/76897 257/763 |
| 2012/0032323 A1* | 2/2012 | Matsumoto ....... H01L 21/76801 257/737 |
| 2012/0205730 A1* | 8/2012 | Chen ................ H01L 27/14609 257/292 |
| 2014/0001574 A1 | 1/2014 | Chen et al. |
| 2014/0110755 A1 | 4/2014 | Colinge |
| 2014/0151812 A1 | 6/2014 | Liaw |
| 2016/0322475 A1* | 11/2016 | Leobandung ..... H01L 29/66795 |
| 2017/0148662 A1* | 5/2017 | Ok ..................... H01L 21/7682 |

FOREIGN PATENT DOCUMENTS

| | | |
|---|---|---|
| KR | 20080001372 A | 1/2008 |
| KR | 20160060799 A | 5/2016 |

* cited by examiner

SEMICONDUCTOR DEVICE AND METHOD

This application claims priority to and the benefit of U.S. Provisional Application No. 62/370,583, filed on Aug. 3, 2016, entitled "Contact Structure and Method of Forming Same," and U.S. Provisional Application No. 62/405,737, filed on Oct. 7, 2016, entitled "Semiconductor Device and Method," which applications are hereby incorporated herein by reference in their entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
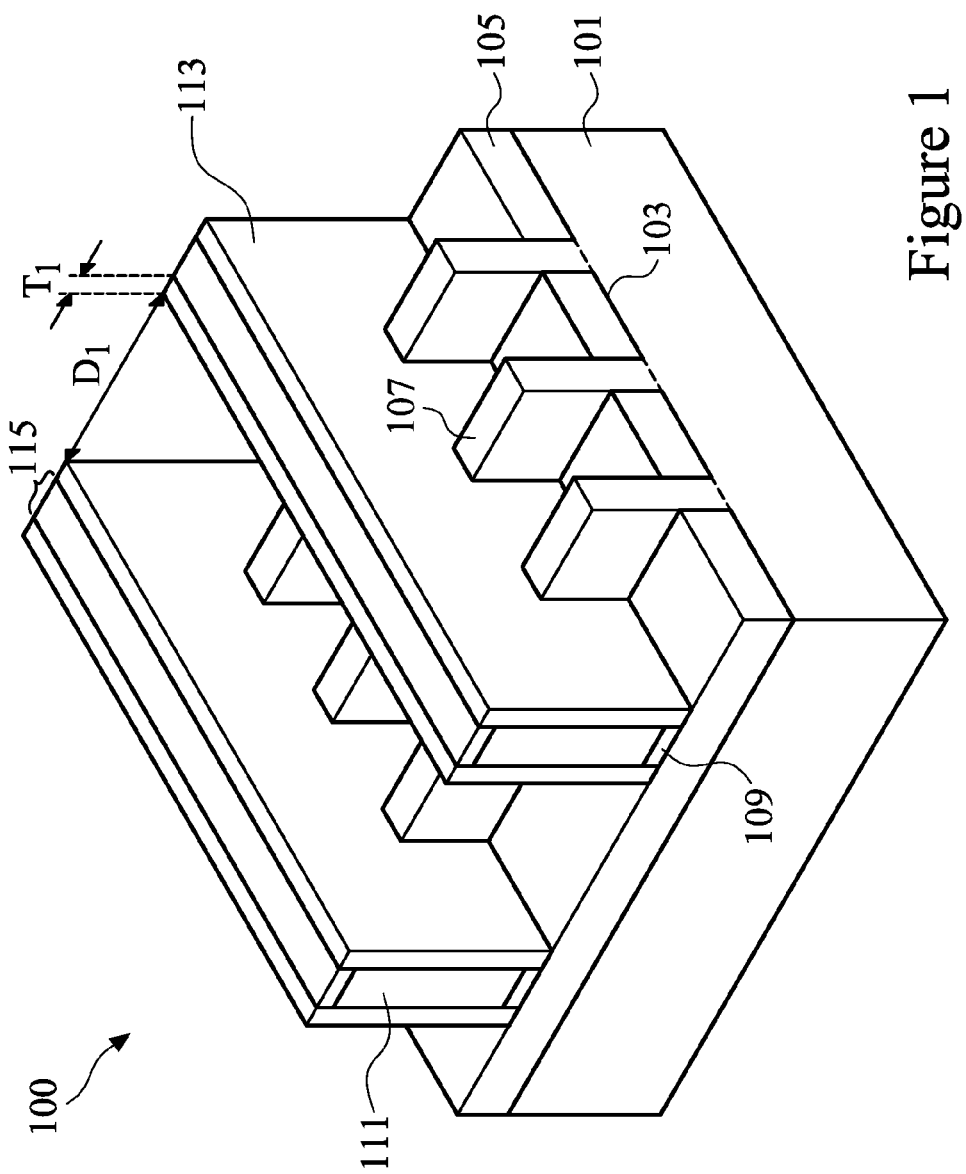
FIG. 1 illustrates steps in a process of forming a finFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is illustrated a perspective view of a semiconductor device 100 such as a finFET device. In an embodiment the semiconductor device 100 comprises a substrate 101 with first trenches 103 formed therein. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates three fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive material and may be selected from a group comprising of W, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a first thickness $T_1$ of between about 5 Å and about 500 Å. Additionally, once the first spacers 113 have been formed, a first spacer 113 adjacent to one stack 115 may be separated from a first spacer 113 adjacent to another stack 115 by a first distance $D_1$ of between about 5 Å and about 1000 Å, such as about 40 Å. However, any suitable thicknesses and distances may be utilized.

Figure 2A:
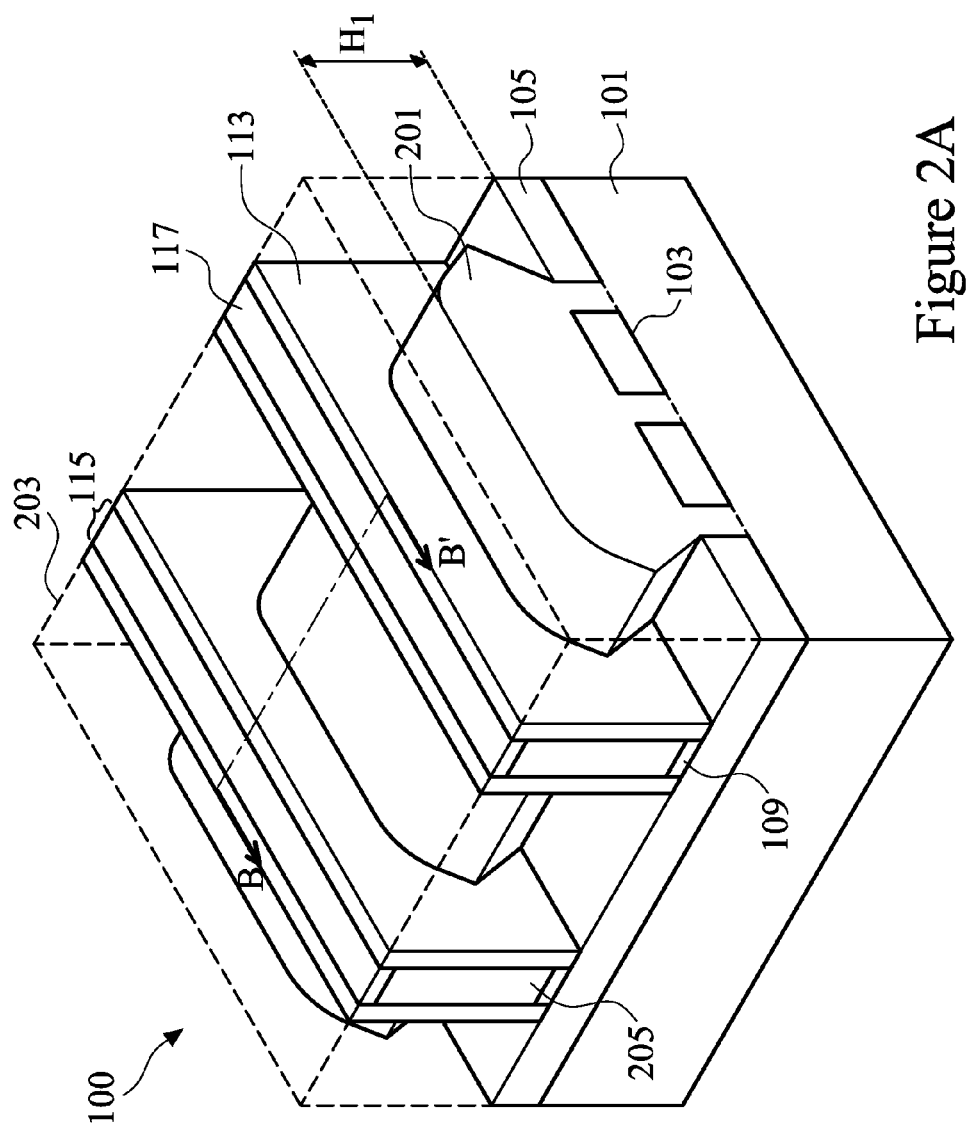
FIGS. 2A-2B illustrate formation of source/drain regions in accordance with some embodiments.
Figure 2B:
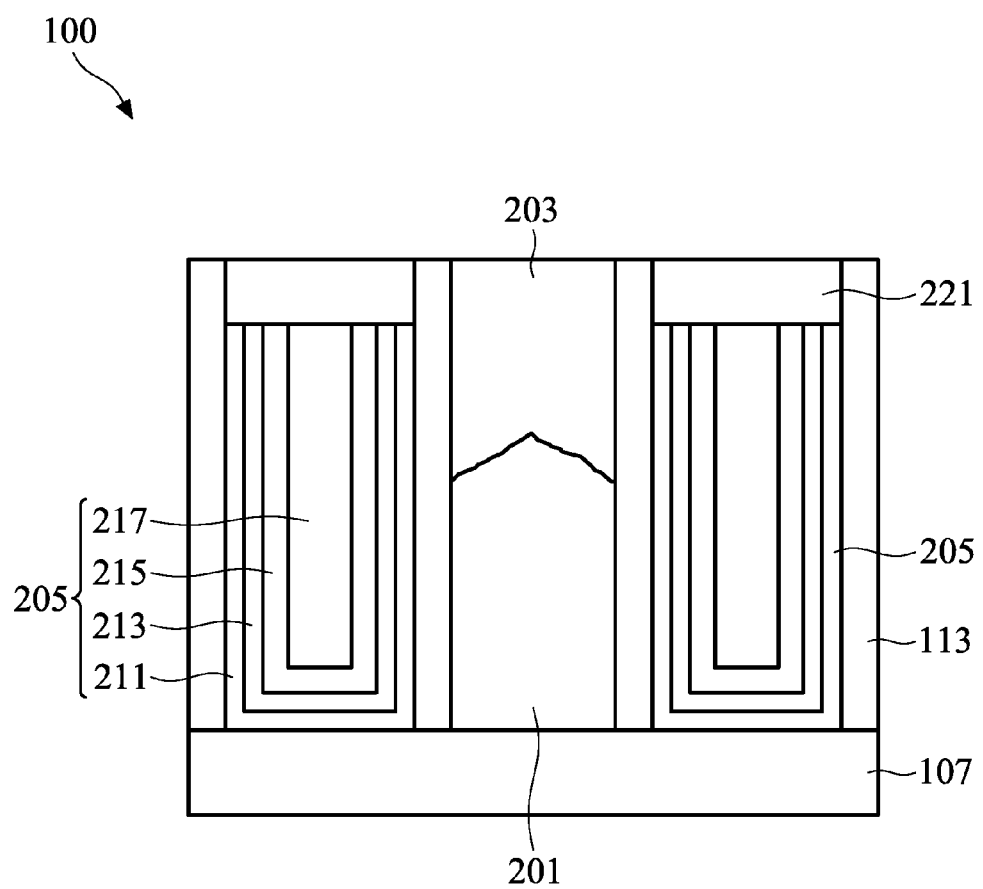

FIGS. 2A-2B illustrate a removal of the fins 107 from those areas not protected by the stacks 115 and the first spacers 113 and a regrowth of source/drain regions 201 (with FIG. 2B illustrating a cross-sectional view of FIG. 2A along line B-B'). The removal of the fins 107 from those areas not protected by the stacks 115 and the first spacers 113 may be performed by a reactive ion etch (RIE) using the stacks 115 and the first spacers 113 as hardmasks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate material 111 to prevent growth and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the stacks 115. In an embodiment wherein the fins 107 comprise silicon and the FinFET is a p-type device, the source/drain regions 201 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes. In other embodiments the source/drain regions 201 may comprise materials such as GaAs, GaP, GaN, InP, InAs, InSb, GaAsP, AlGaN, AlInAs, AlGaAs, GaInAs, GaInP, and/or GaInAsP; or combinations, or the like.

In an embodiment the source/drain regions 201 may be formed to have a thickness of between about 5 Å and about 1000 Å and a first height $H_1$ over the first isolation regions 105 of between about 1 nm and about 100 nm, such as about 55 nm. In this embodiment, the source/drain regions 201 may be formed to have a height above the upper surface of the first isolation regions 105 of between about 5 nm and about 250 nm, such as about 100 nm. However, any suitable height may be utilized.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present invention to the steps presented above.

Additionally at this point the hard mask that covered the dummy gate material 111 during the formation of the source/drain regions 201 is removed. In an embodiment the hard mask may be removed using, e.g., a wet or dry etching process that is selective to the material of the hard mask. However, any suitable removal process may be utilized.

FIG. 2A also illustrates a formation of an inter-layer dielectric (ILD) layer 203 (illustrated in dashed lines in FIG. 2A in order to more clearly illustrate the underlying structures) over the stacks 115 and the source/drain regions 201. The ILD layer 203 may comprise a material such as boron phosphorous silicate glass (BPSG), although any suitable dielectrics may be used. The ILD layer 203 may be formed using a process such as PECVD, although other processes, such as LPCVD, may alternatively be used. The ILD layer 203 may be formed to a thickness of between about 100 Å and about 3,000 Å. Once formed, the ILD layer 203 may be planarized with the first spacers 113 using, e.g., a planarization process such as chemical mechanical polishing process, although any suitable process may be utilized.

After the formation of the ILD layer 203, the material of the dummy gate electrode 111 and the dummy gate dielectric 109 may be removed and replaced to form the gate stack 205. In an embodiment the dummy gate electrode 111 may be removed using, e.g., a wet or dry etching process that utilizes etchants that are selective to the material of the dummy gate electrode 111. However, any suitable removal process may be utilized.

Once the dummy gate electrode 111 has been removed, the openings left behind may be refilled to form the gate stack 205. In a particular embodiment the gate stack 205 comprises a first dielectric material 211, a first metal material 213, a second metal material 215, and a third metal material 217. In an embodiment the first dielectric material 211 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material 211 may be deposited to a thickness of between about 5 Å and about 200 Å, although any suitable material and thickness may be utilized.

The first metal material 213 may be formed adjacent to the first dielectric material 211 and may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material 213 may be deposited using a deposition process such as atomic layer deposition, chemical vapor deposition, sputtering, or the like, to a thickness of between about 5 Å and about 200 Å, although any suitable deposition process or thickness may be used.

The second metal material 215 may be formed adjacent to the first metal material 213 and, in a particular embodiment, may be similar to the first metal material 213. For example, the second metal material 215 may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second metal material 215 may be deposited using a deposition process such as atomic layer deposition, chemical vapor deposition, sputtering, or the like, to a thickness of between about 5 Å and about 200 Å, although any suitable deposition process or thickness may be used.

The third metal material 217 fills a remainder of the opening left behind by the removal of the dummy gate electrode 111. In an embodiment the third metal material 217 is a metallic material such as W, Al, Cu, AlCu, W, Ti, TiAlN, TaC, TaCN, TaSiN, Mn, Zr, TiN, Ta, TaN, Co, Ni, combinations of these, or the like, and may be deposited using a deposition process such as atomic layer deposition, chemical vapor deposition, sputtering, or the like to fill and/or overfill the opening left behind by the removal of the dummy gate electrode 111. In a particular embodiment the third metal material 217 may be deposited to a thickness of between about 5 Å and about 500 Å, although any suitable material, deposition process, and thickness may be utilized.

Once the opening left behind by the removal of the dummy gate electrode 111 has been filled, the materials may be planarized in order to remove any material that is outside of the opening left behind by the removal of the dummy gate electrode 111. In a particular embodiment the removal may be performed using a planarization process such as chemical mechanical polishing. However, any suitable planarization and removal process may be utilized.

After the materials of the gate stack 205 have been formed and planarized, the materials of the gate stack 205 may be recessed and capped with a capping layer 221. In an embodiment the materials of the gate stack 205 may be recessed using, e.g., a wet or dry etching process that utilizes etchants selective to the materials of the gate stack 205. In an embodiment the materials of the gate stack 205 may be recessed a distance of between about 5 nm and about 150 nm, such as about 120 nm. However, any suitable process and distance may be utilized.

Once the materials of the gate stack 205 have been recessed, the capping layer 221 may be deposited and planarized with the first spacers 113. In an embodiment the capping layer 221 is a material such as SiN, SiON, SiCON, SiC, SiOC, combinations of these, or the like, deposited using a deposition process such as atomic layer deposition, chemical vapor deposition, sputtering, or the like. The capping layer 221 may be deposited to a thickness of between about 5 Å and about 200 Å, and then planarized using a planarization process such as chemical mechanical polishing such that the capping layer 221 is planar with the first spacers 113.

Figure 3:
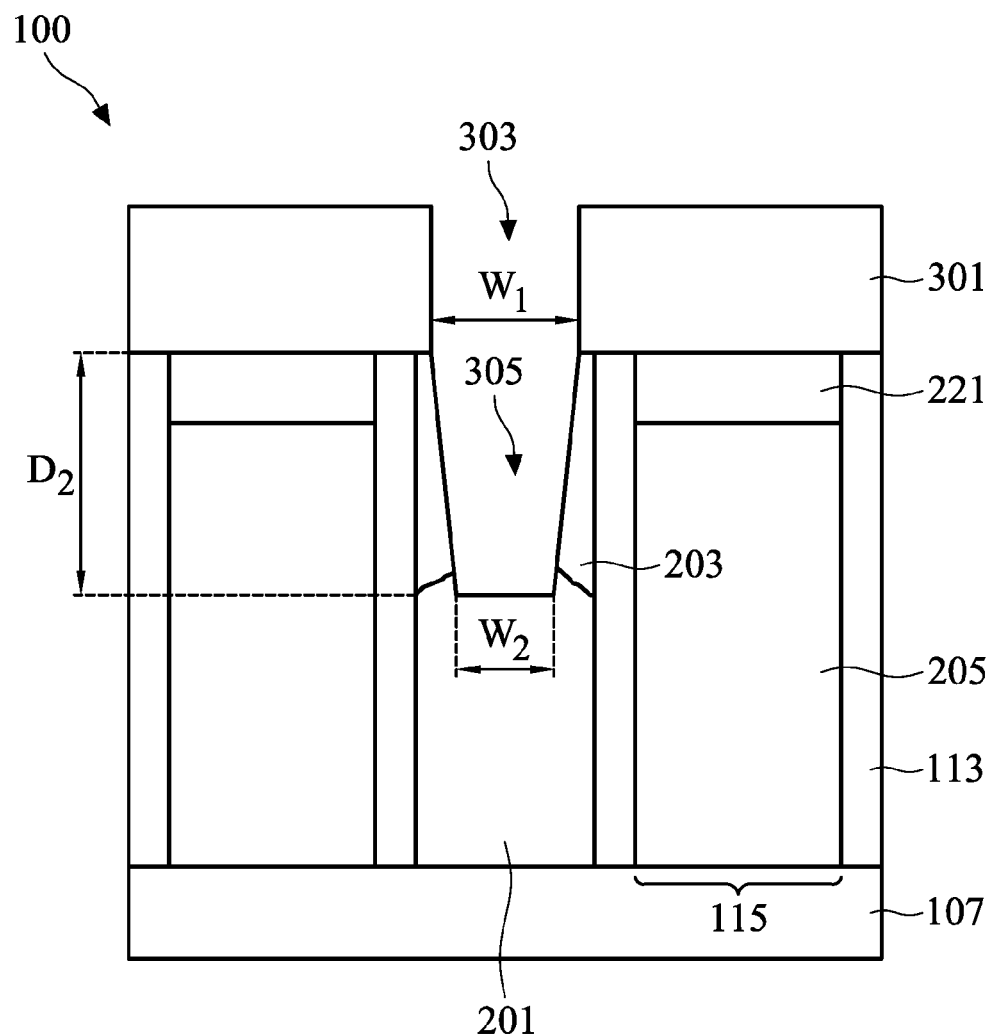
FIG. 3 illustrates a formation of a first opening in accordance with some embodiments.

FIG. 3 illustrates a formation of a first opening 305 through the ILD layer 203 in order to expose the source/drain regions 201 in preparation for formation of a first contact 401 (not illustrated in FIG. 3 but illustrated and described below with respect to FIG. 4). Additionally, for convenience, the gate stack 205 is illustrated in a simplified form without showing the additional layers. In an embodiment the first opening 305 may be formed by initially placing and patterning a hardmask 301 over the source/drain regions 201. In an embodiment the hardmask 301 may be a dielectric material such as silicon nitride, although any suitable masking material may be utilized.

Once the hardmask 301 has been placed, the hardmask 301 is patterned. In an embodiment hardmask 301 may be patterned by depositing and then exposing a photosensitive material onto the hardmask 301. The impact of the energy will cause a chemical reaction in those parts of the photosensitive material that were impacted by the patterned energy source, thereby modifying the physical properties of the exposed portions of the photoresist such that the physical properties of the exposed portions of the photosensitive material are different from the physical properties of the unexposed portions of the photosensitive material. The photosensitive material may then be developed with, e.g., a developer (not separately illustrated), in order to separate the exposed portion of the photosensitive material from the unexposed portion of the photosensitive material, and then the hardmask 301 may be patterned using an anisotropic etch and the photosensitive material as a mask.

Once the hardmask 301 has been patterned, the first opening 305 may be formed using the hardmask 301 as a mask. In an embodiment the first opening 305 may be formed using a first etching process (represented in FIG. 3 by the wavy line labeled 303), which may be an anisotropic etching process such as a reactive ion etch process. However, any suitable process, such as a wet etching process, and any suitable reactants may be used.

The first etching process 303 may be utilized to form the first opening 305 in preparation for a formation of the first contact 401. In a particular embodiment the first etching process 303 may be utilized to remove the material of the ILD layer 203 to a second distance $D_2$ of between about 10 nm and about 100 nm, such as about 80 nm. However, any suitable depth may be utilized. Additionally, the first opening 305 at a point adjacent to a top of the first spacer 113 may have a first width $W_1$ (from the hardmask 301) of between about 10 nm and about 50 nm, and may also have a second width $W_2$ at a bottom of the first opening 305 of between about 8 nm and about 40 nm. However, any suitable dimensions may be utilized.

Once the first opening 305 has been formed, the hardmask 301 may be removed. In an embodiment the hardmask 301 may be removed using, e.g., a wet or dry etching process that uses an etchant selective to the material of the hardmask 301. However, any suitable removal process may also be utilized.

Figure 4:
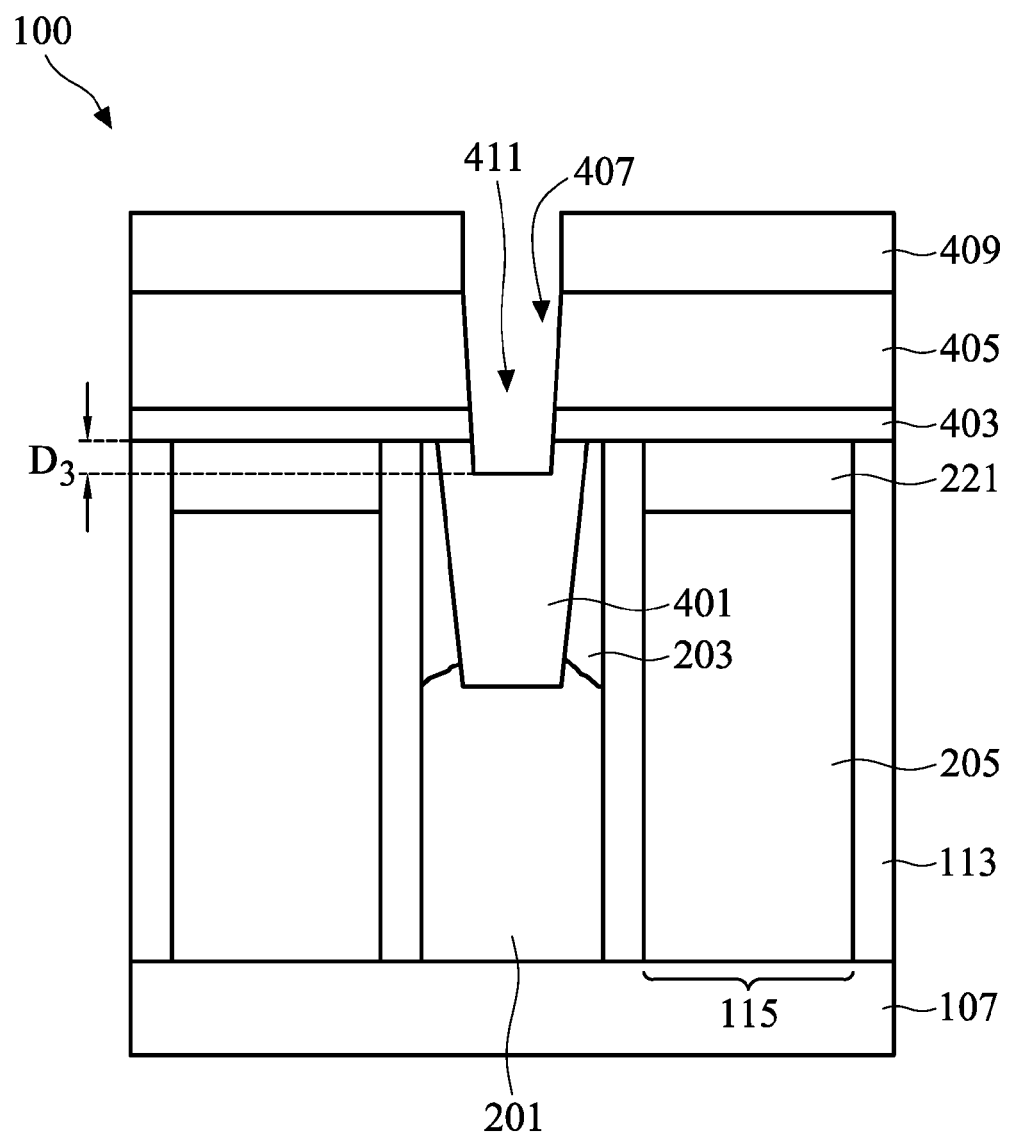
FIG. 4 illustrates a formation of a dielectric layer and a second opening in accordance with some embodiments.

FIG. 4 illustrates a formation of the first contact 401 as well as formation of a first etch stop layer 403 and a first dielectric layer 405. Optionally, prior to formation of the first contact 401, a silicide contact may be formed. The silicide contact may comprise titanium, nickel, cobalt, or erbium in order to reduce the Schottky barrier height of the contact. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process. The thickness of the silicide contact may be between about 5 nm and about 50 nm.

In an embodiment the first contact 401 may be a conductive material such as Al, Cu, W, Co, Ti, Ta, Ru, TiN, TiAl, TiAlN, TaN, TaC, NiSi, CoSi, combinations of these, or the like, although any suitable material may be deposited into the first opening 305 using a deposition process such as sputtering, chemical vapor deposition, electroplating, electroless plating, or the like, to fill and/or overfill the first opening 305 formed by the first etching process 303. Once filled or overfilled, any deposited material outside of the first opening 305 formed by the first etching process 303 may be removed using a planarization process such as chemical mechanical polishing (CMP). However, any suitable material and process of formation may be utilized. Additionally, the first contact 401 may have a thickness of between about 5 Å and about 2000 Å and will have the first width $W_1$ and the second width $W_2$.

In one embodiment, the first etch stop layer 403 may be formed of silicon nitride using plasma enhanced chemical vapor deposition (PECVD), although other materials such as SiON, SiCON, SiC, SiOC, $SiC_xN_y$, $SiO_x$, other dielectrics, combinations thereof, or the like, and alternative techniques of forming the first etch stop layer 403, such as low pressure CVD (LPCVD), PVD, or the like, could alternatively be used. The first etch stop layer 403 may have a thickness of between about 5 Å and about 500 Å.

Once the first etch stop layer 403 has been formed, the first dielectric layer 405 is formed. The first dielectric layer 405 may be made of one or more suitable dielectric materials such as low-k dielectrics such as carbon doped oxides, extremely low-k dielectrics such as porous carbon doped silicon dioxide, silicon oxide, silicon nitride, a polymer such as polyimide, combinations of these, or the like. The first dielectric layer 405 may be formed through a process such as a spin-on process or a chemical vapor deposition (CVD), although any suitable process may be utilized, and may have a thickness of between about 10 Å and about 500 Å, such as about 100 Å.

FIG. 4 also illustrates a patterning of both the first dielectric layer 405 and the first etch stop layer 403 to form a second opening 407 that exposes the first contact 401. In an embodiment the first dielectric layer 405 and the first etch stop layer 403 may be patterned by initially placing and patterning a second photoresist 409 over the first dielectric layer 405. In an embodiment, the second photoresist 409 may be a tri-layer photoresist that is exposed with a patterned energy in order to pattern the second photoresist 409. The second photoresist 409 may then be developed and etched to pattern the second photoresist 409.

Once the second photoresist 409 has been patterned, the pattern of the second photoresist 409 may be transferred to the first dielectric layer 405 and the first etch stop layer 403 using the second photoresist 409 as a mask. In an embodiment the first dielectric layer 405 may be patterned using a second etching process (represented in FIG. 4 by the wavy line labeled 411), which may be an anisotropic etching process such as a reactive ion etch process. However, any suitable process, such as a wet etching process, and any suitable reactants may be used.

The second etching process 411 may be utilized to remove the material of the first dielectric layer 405 to form the second opening 407 in preparation of a formation of a second contact 501 (not illustrated in FIG. 4 but illustrated and discussed below with respect to FIG. 5). In a particular embodiment the second etching process 411 may be utilized to remove the material of the first dielectric layer 405 until the first etch stop layer 403 is exposed. However, any suitable process of removal, such as a wet etch, may be utilized.

Once the first etch stop layer 403 has been exposed, the pattern of the first dielectric layer 405 may be transferred through the first etch stop layer 403 to expose the first contact 401. In an embodiment the pattern may be transferred using, e.g., an anisotropic etch process, such as a reactive ion etch, that uses etchants selective to the material of the first etch stop layer 403. However, any suitable etchants or processes, such as a wet etch, may also be utilized.

Additionally, after the first etch stop layer 403 has been opened to expose the underlying first contact 401, the etching may either be stopped without extending into the first contact 401 or else may be continued to slightly overetch and form the second opening 407 to extend partially into the first contact 401. In a particular embodiment the second opening 407 may extend into the first contact 401 a third distance $D_3$ of between about 2 nm and about 20 nm, such as less than about 1.0 nm. However, any suitable distance may be utilized.

Figure 5:
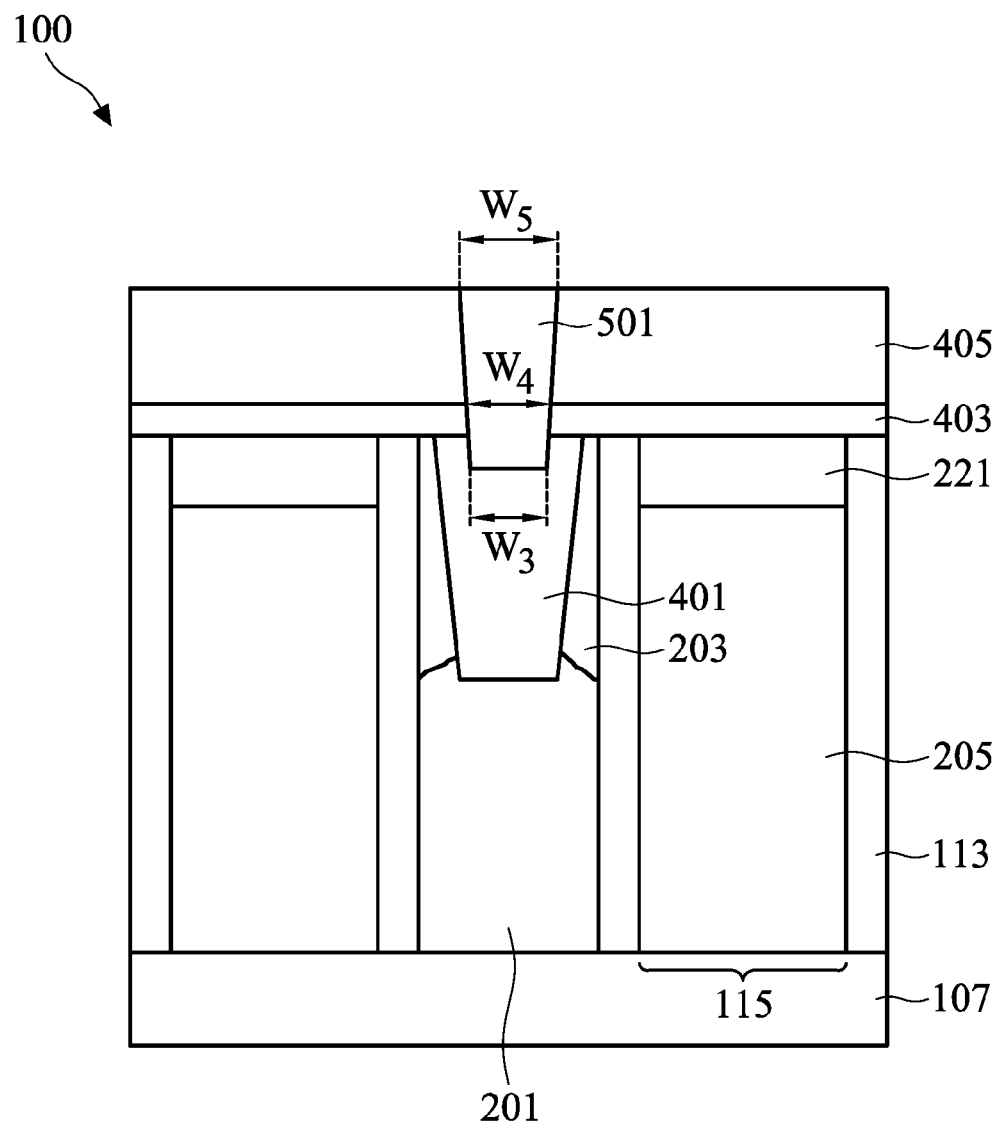
FIG. 5 illustrates a formation of a second contact in accordance with an embodiment.

FIG. 5 illustrates a removal of the second photoresist 409 as well as a formation of the second contact 501. In an embodiment the second photoresist 409 may be removed using, e.g., an ashing process, whereby a temperature of the second photoresist 409 is increased until the second photoresist 409 undergoes a thermal decomposition, at which point the second photoresist 409 may be easily removed. However, any suitable removal process, such as a wet etch, may also be utilized.

Once the first contact 401 has been exposed, a conductive material may be deposited to fill and/or overfill the second opening 407 to make electrical connection with the first contact 401. In an embodiment the second contact 501 may be a conductive material such as tungsten (W), although any suitable material, such as aluminum, copper, alloys of these, combinations of these, or the like, and may be deposited using a deposition process such as sputtering, chemical vapor deposition, electroplating (with a seed layer), electroless plating, or the like, to fill and/or overfill the second opening 407.

Once filled or overfilled, any deposited material outside of the second opening 407 may be removed using a planarization process such as chemical mechanical polishing (CMP). By filling the second opening 407, the second contact 501 will take on the shape of the second opening 407, and will have a series of increasing widths as the second contact 501 extends away from the first contact 401. In a particular embodiment, the second contact 501 may have a third width $W_3$ adjacent to the first contact 401 of between about 3 nm and about 20 nm, while adjacent to a top surface of the first etch stop layer 403 the second contact 501 may have a fourth width $W_4$ of between about 3 nm and about 30 nm. Additionally, at the top of the second contact 501 the second contact 501 may have a fifth width $W_5$ of between about 5 nm and about 35 nm. However, any suitable dimensions may be utilized.

In a particular embodiment the various widths of the first contact 401 and the second contact 501 are related to each other to ensure proper contact. In one example, a ratio of the first width $W_1$ to the fourth width $W_4$ is greater than 1, while a ratio of the fifth width $W_5$ to the third width $W_3$ is also greater than 1. In another embodiment a ratio of the third width $W_3$ to the second width $W_2$ is less than 1 and a ratio of the second width $W_2$ to the fourth width $W_4$ is greater than 1 such that the fourth width $W_4$—the second width $W_2$ is less than zero. In yet another embodiment, the first width $W_1$ is greater than the second width $W_2$, which is greater than the fifth width $W_5$, which is greater than the fourth width $W_4$, which is greater than the third width $W_3$.

Figure 6A:
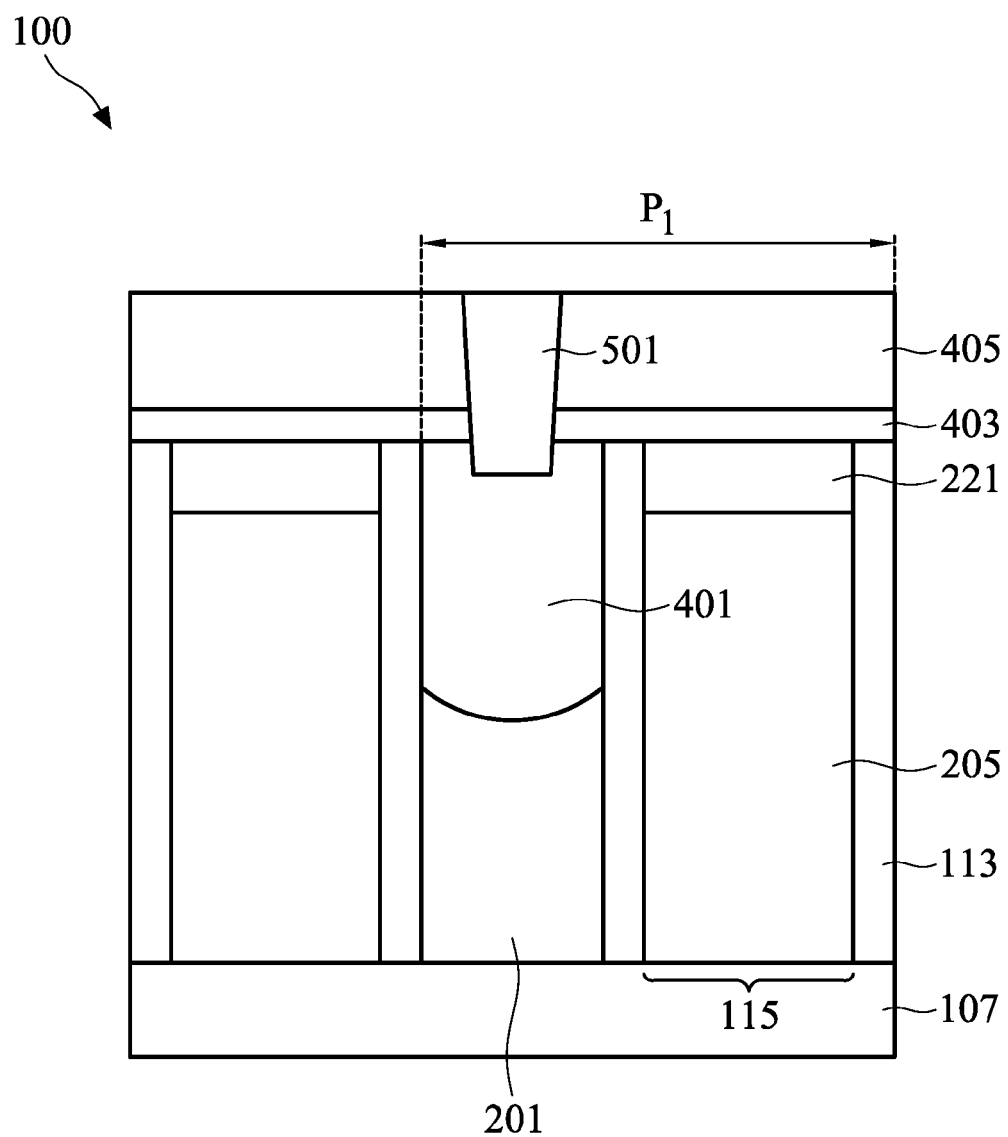
FIGS. 6A-6C illustrate a tuning of a source/drain region in accordance with an embodiment.
Figure 6B:
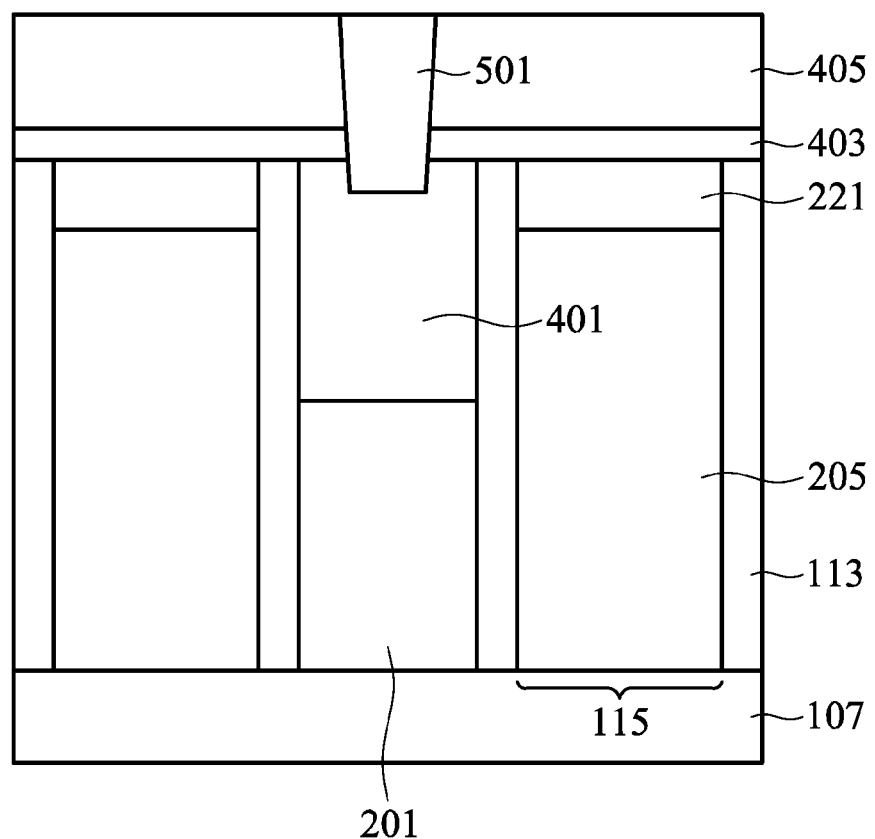
Figure 6C:
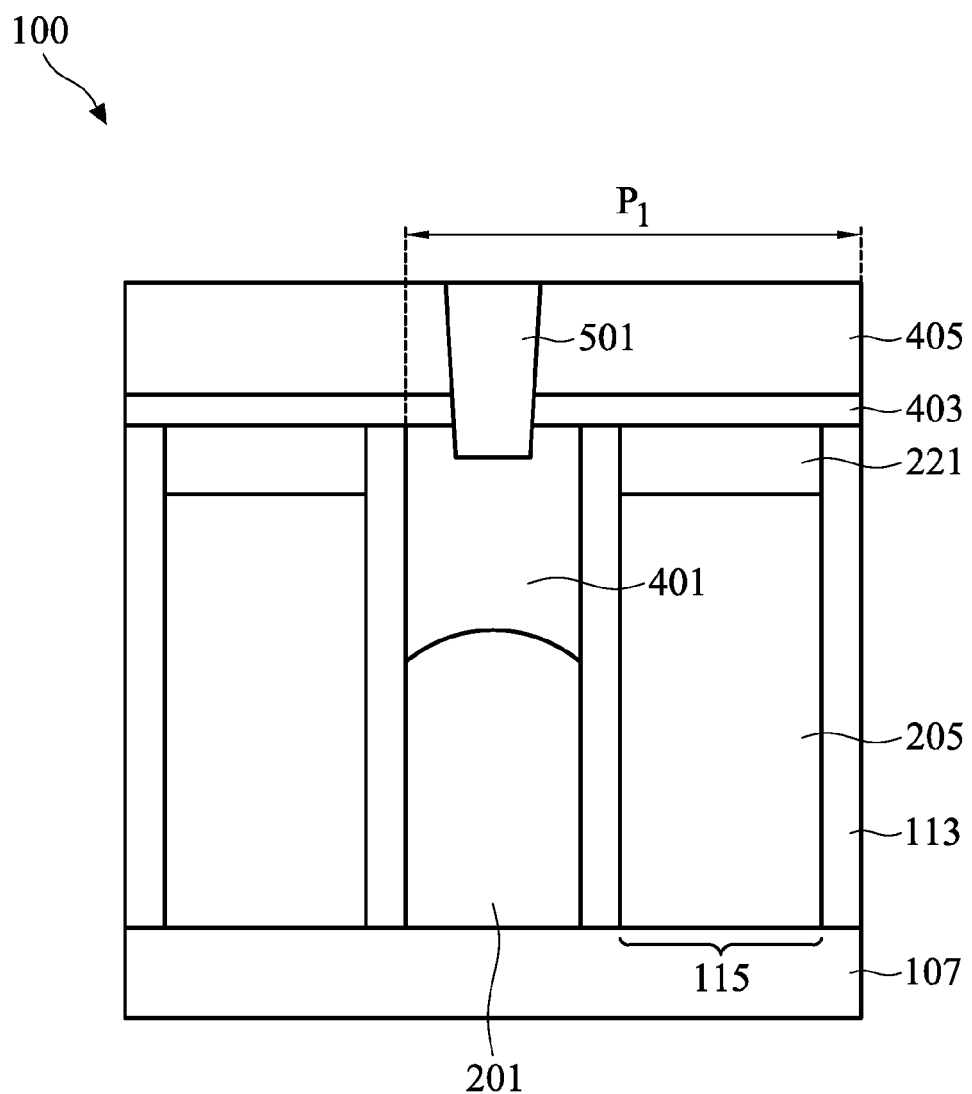

FIGS. 6A-6C illustrate additional embodiments in which the shape of the source/drain regions 201 is tuned as desired. In the embodiment illustrated in FIG. 6A the shape of the top surface of the source/drain region 201 is tuned to have a concave shape within a structure wherein the distance between adjacent gate stacks 205 is a first pitch $P_1$ of less than about 15 nm. In a particular embodiment the concave shape may be obtained during the etching of the ILD layer 203 to expose the source/drain region 201 by overetching the source/drain region 201 after the source/drain region 201 has been exposed. For example, in an embodiment in which end point detection is utilized to determine when the source/drain region 201 has been exposed, an additional overetch of less than about 30% of the time to the end point detection may be performed. This additional overetch, in combination with the pitch, causes the source/drain region 201 to have the concave top surface shape as well as fully removing the ILD layer 203.

Looking next at FIG. 6B, the shape of the top surface of the source/drain region 201 is tuned to have a planar shape as it extends between the first spacers 113. In the embodiment illustrated in FIG. 6B the shape of the top surface of the source/drain region 201 is tuned to have a planar shape within a structure wherein the channel length of the device is greater than about 50 nm. In a particular embodiment the planar shape may be obtained during the etching of the ILD layer 203 to expose the source/drain region 201 by stopping the etching when the endpoint detection indicates that the source/drain region 201 has been exposed. This etching, in combination with the channel length, causes the source/drain region 201 to have the planar top surface shape as well as fully removing the ILD layer 203.

Looking next at FIG. 6C, the shape of the top surface of the source/drain region 201 is tuned to have a convex shape as it extends between the first spacers 113. In this embodiment a similar removal process as described above with respect to FIG. 6A (e.g., an etching process to expose the source/drain region 201) may be performed. However, in this embodiment the first pitch $P_1$ of the gate stacks 205 may be between about 15 nm and about 20 nm. As such, by utilizing the removal process along with the overetch, the shape of the top surface of the source/drain region 201 is tuned to have the convex shape.

Figure 7A:
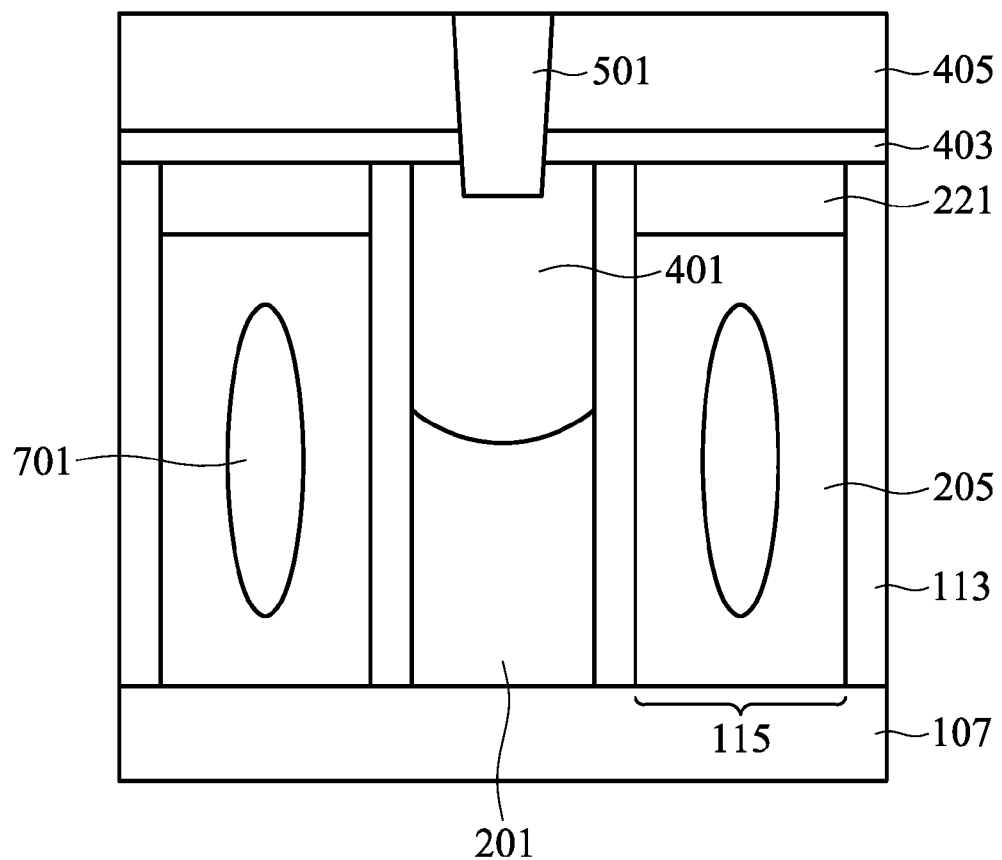
FIGS. 7A-7C illustrate a formation of a seam in accordance with an embodiment.
Figure 7B:
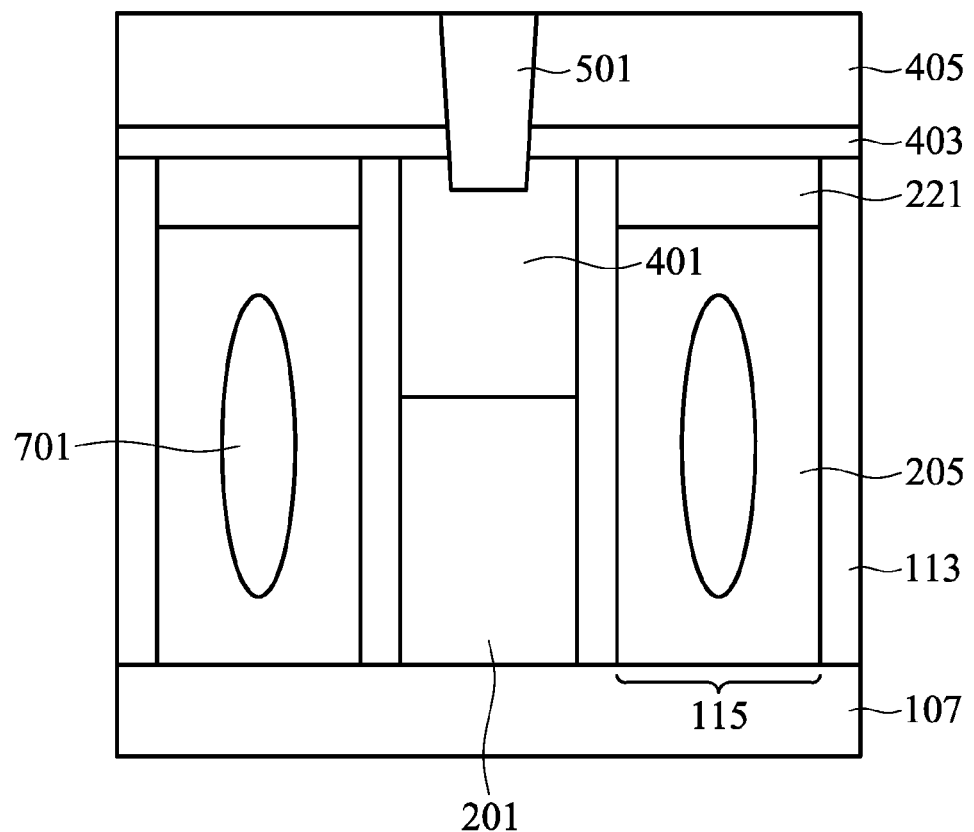
Figure 7C:
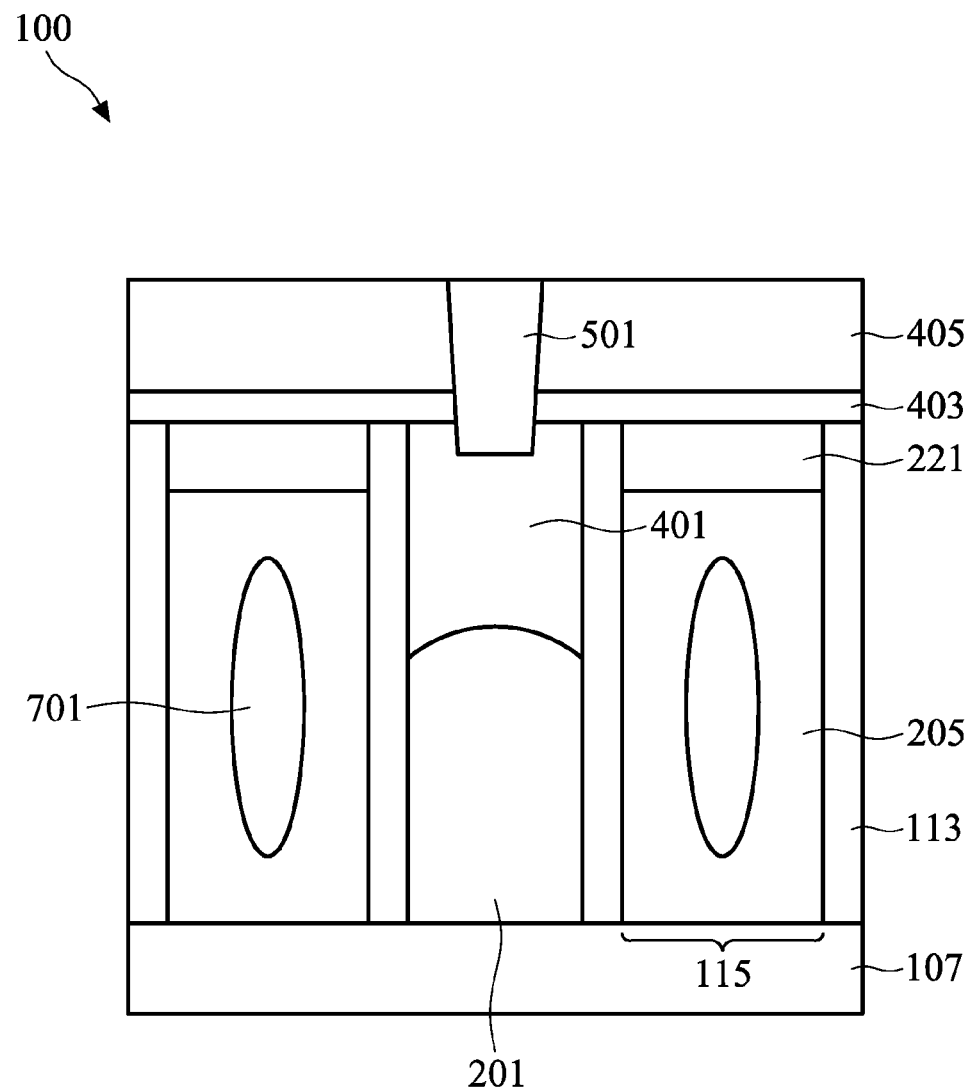

FIGS. 7A-7C illustrate additional embodiments similar to the embodiments described above with respect to FIGS. 6A-6C, respectively. In these embodiments, rather than have a seamless gate stack 205, the gate stack 205 comprises a seam 701 or void within the material of the gate stack 205. The seam 701 is formed during the deposition process for the third metal material 217 within the gate stack 205 when the gate width is small for a short-channel device and a non-conformal deposition process is utilized. In a particular embodiment to obtain the formation of the seam 701, a non-conformal deposition process such as chemical vapor deposition or physical vapor deposition is utilized on a device wherein the gate width is equal to or less than 15 nm.

Figure 8A:
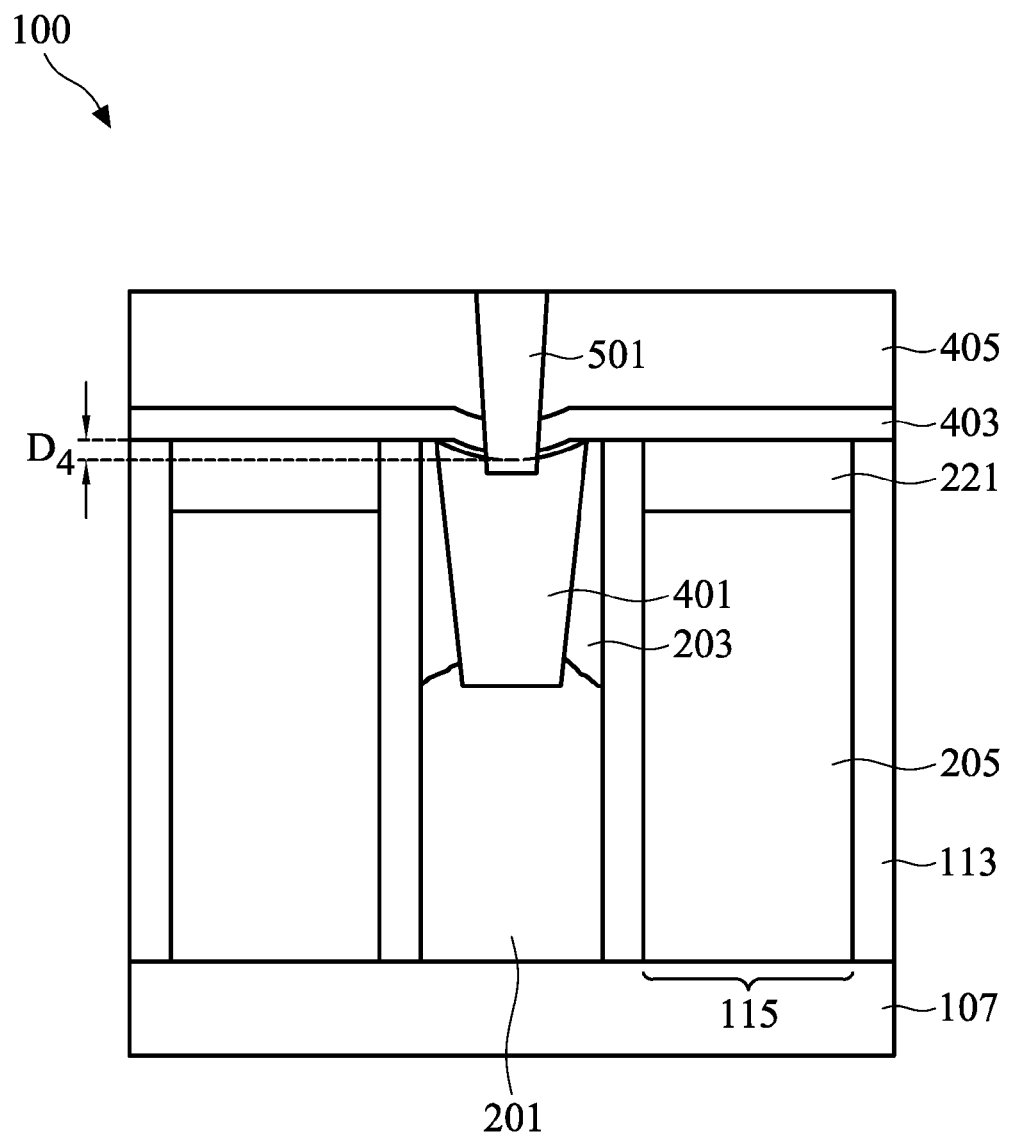
FIGS. 8A-8B illustrate a tuning of the first contact in accordance with an embodiment.
Figure 8B:
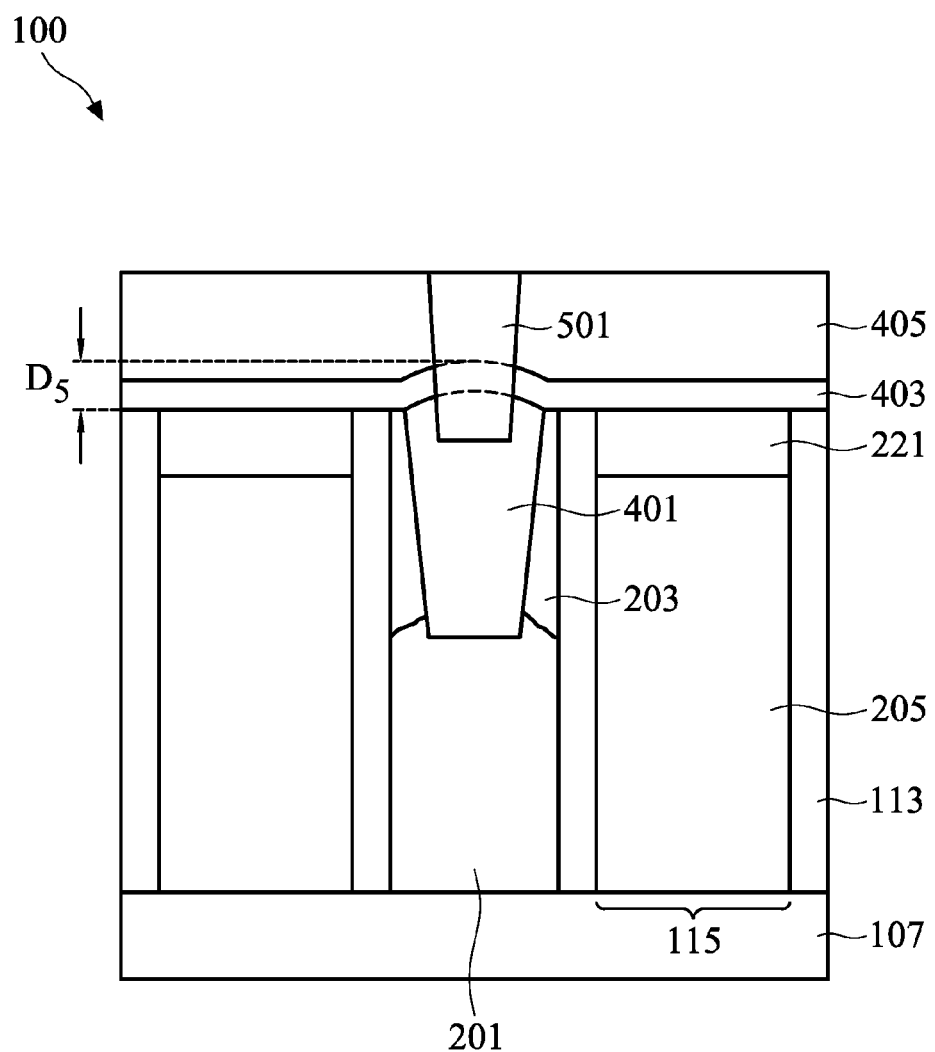

FIGS. 8A-8B illustrate further embodiments in which the shape of the top surface of the first contact 401 is tuned away from a planar shape as described above. In the embodiment illustrated in FIG. 8A, the top surface of the first contact 401 is adjusted such that the top surface of the first contact 401 has a concave shape. In an embodiment the top surface of the first contact 401 may dip downward by a fourth distance $D_4$ of between about 1 nm and about 10 nm. However, any suitable distance may be utilized.

To obtain the concave shape of the first contact 401, the planarization process described above with respect to FIG. 4 may be modified. In particular, in an embodiment in which the planarization process is a chemical mechanical polish which uses a slurry, the slurry may be chosen in order to preferentially be selective towards the material of the first contact 401 (e.g., tungsten) such that the material of the first contact 401 has a high etch rate. With such a high etch rate, the material of the first contact 401 will dish, thereby causing the material of the first contact 401 to recess into the concave shape.

FIG. 8B illustrates another embodiment in which the top surface of the first contact 401, instead of being tuned to have a concave shape, is instead tuned to have a convex shape. In this embodiment the top surface of the first contact 401 may extend upwards such that a central height of the first contact 401 is higher than an edged height of the first contact 401 by a fifth distance $D_5$ of greater than about 1 nm. However, any suitable distance may be utilized.

To obtain the convex shape of the first contact 401, the planarization process described above with respect to FIG. 4 may be modified. In particular, in an embodiment in which the planarization process is a chemical mechanical polish which uses a slurry, the slurry may be chosen in order to slowly remove the material of the first contact 401. With such a slower removal of the material of the first contact 401, the material of the first contact 401 will be removed at a slower rate and cause the material of the first contact 401 to form into the convex shape.

In another embodiment, the shape of the top surface of the first contact 401 may be tuned not by modifying the slurry but by modifying the first pitch P1 between the gate stacks 205. In an embodiment in which the concave shape of FIG. 8A is desired, the first pitch $P_1$ may be formed to be greater than about 80 nm. In an embodiment in which the convex shape of FIG. 8B is desired, the first pitch $P_1$ may be modified to be smaller than 30 nm. Finally, if it is desired that the top surface of the first contact 401 be planar, than the first pitch $P_1$ may be tuned to be between about 30 nm and about 80 nm.

Figure 9A:
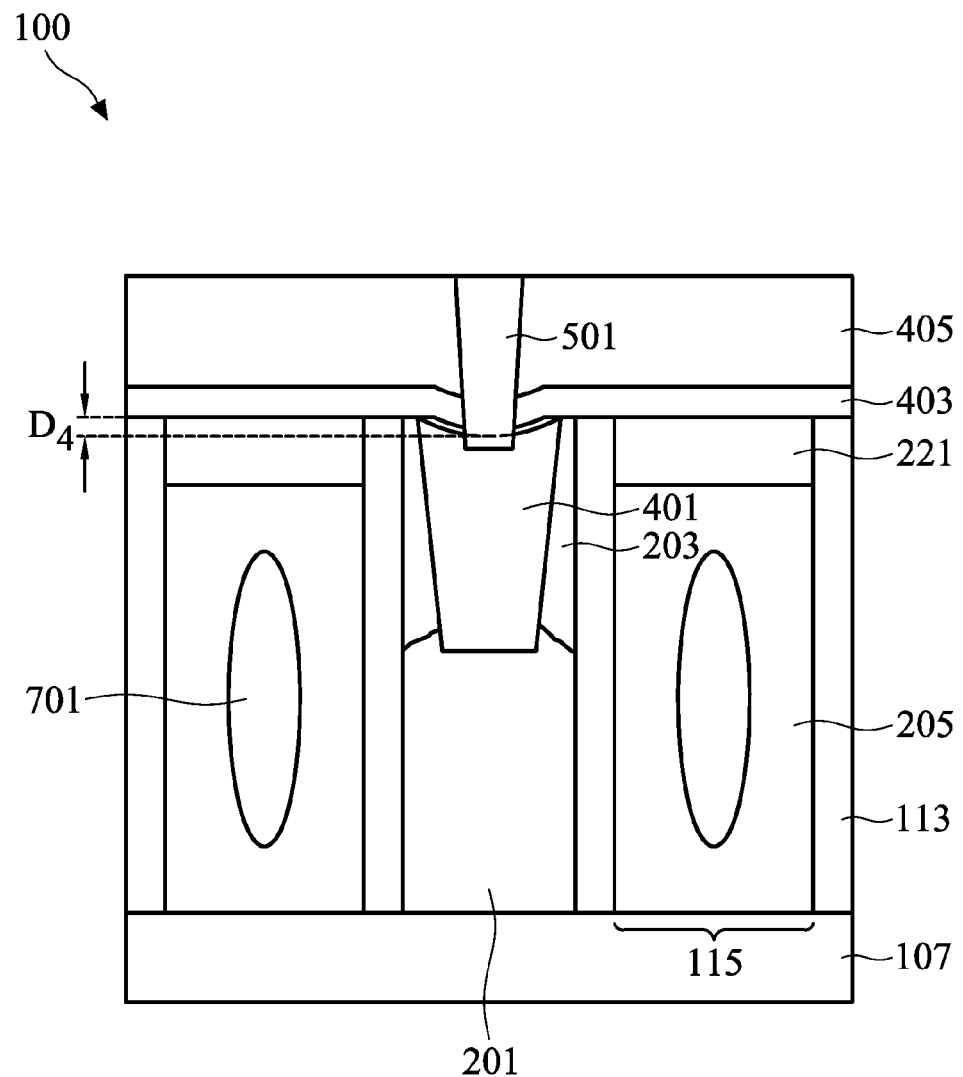
FIGS. 9A-9C illustrate a formation of a seam in accordance with an embodiment.
Figure 9B:
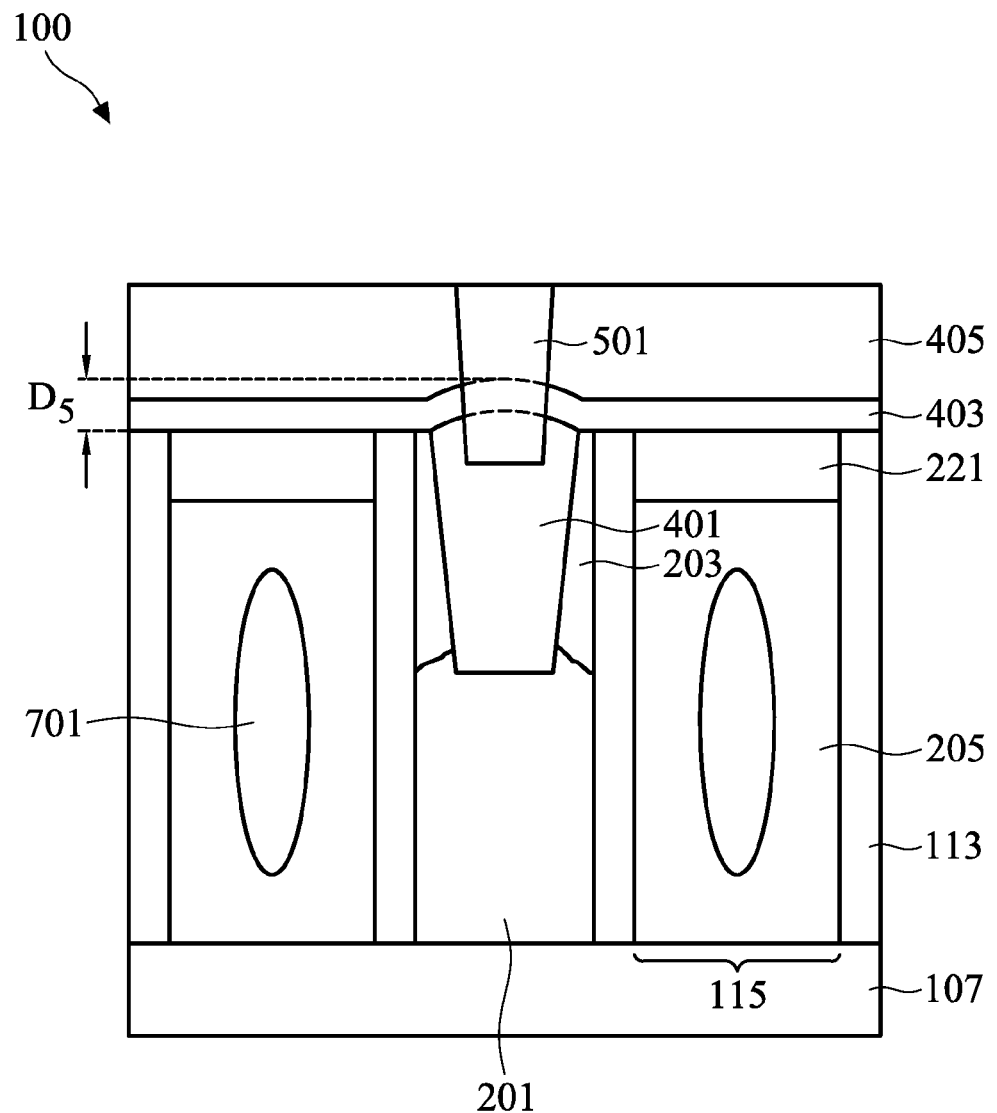
Figure 9C:
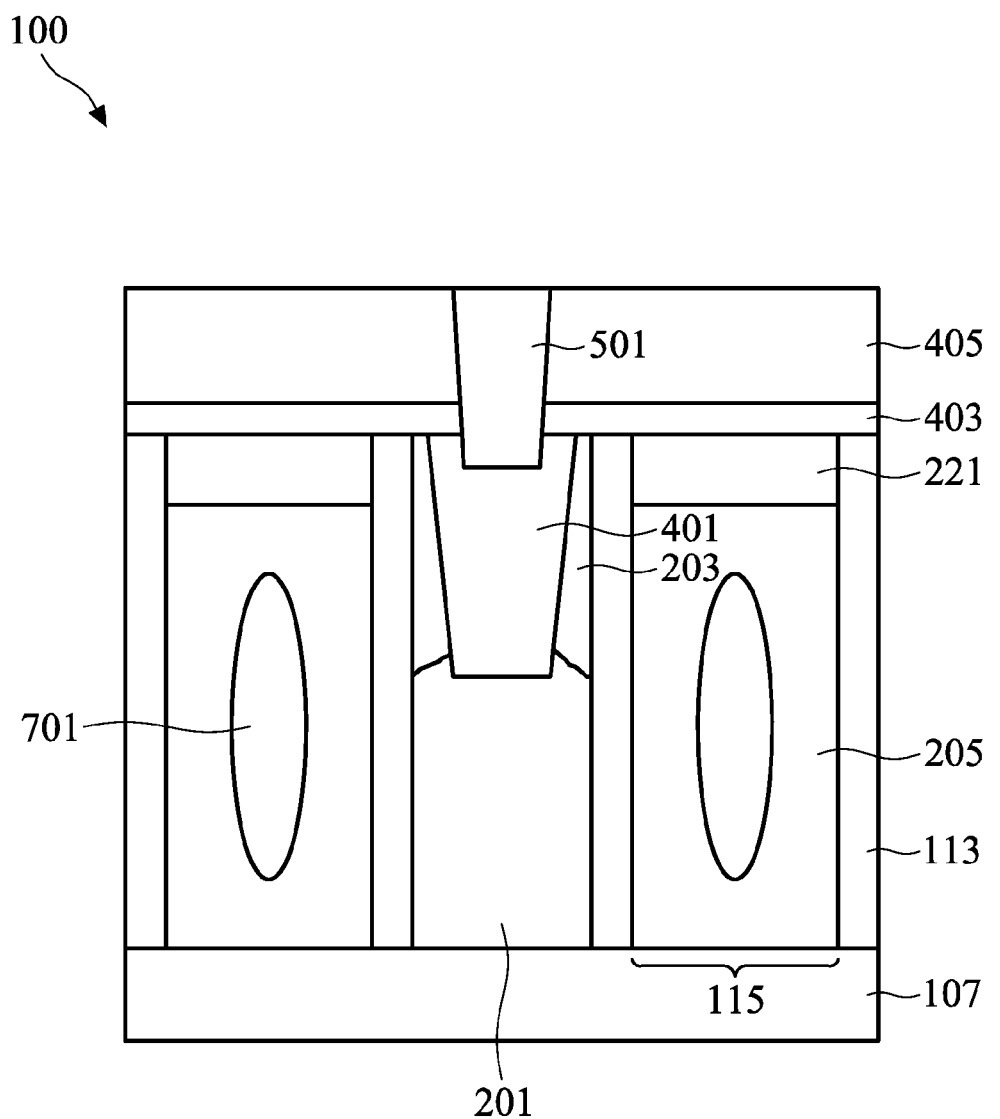

FIGS. 9A-9C illustrate further embodiments similar to the embodiments described in FIGS. 8A-8C, respectively. In the embodiments illustrated in FIGS. 9A-9C, however, the gate stack 205 is formed to include the seams 701 as discussed above with respect to FIGS. 7A-7C.

Figure 10A:
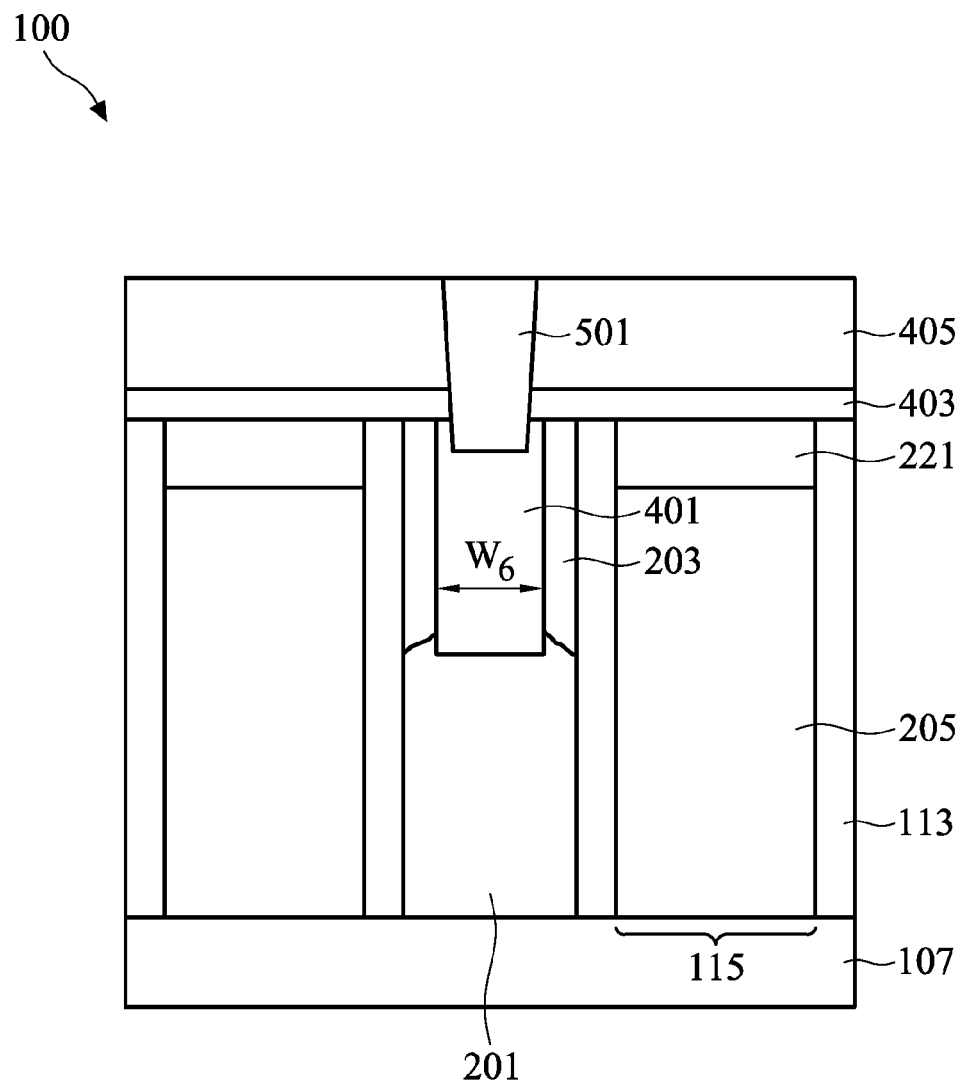
FIGS. 10A-10B illustrate vertical sidewalls on the first contact in accordance with an embodiment.
Figure 10B:
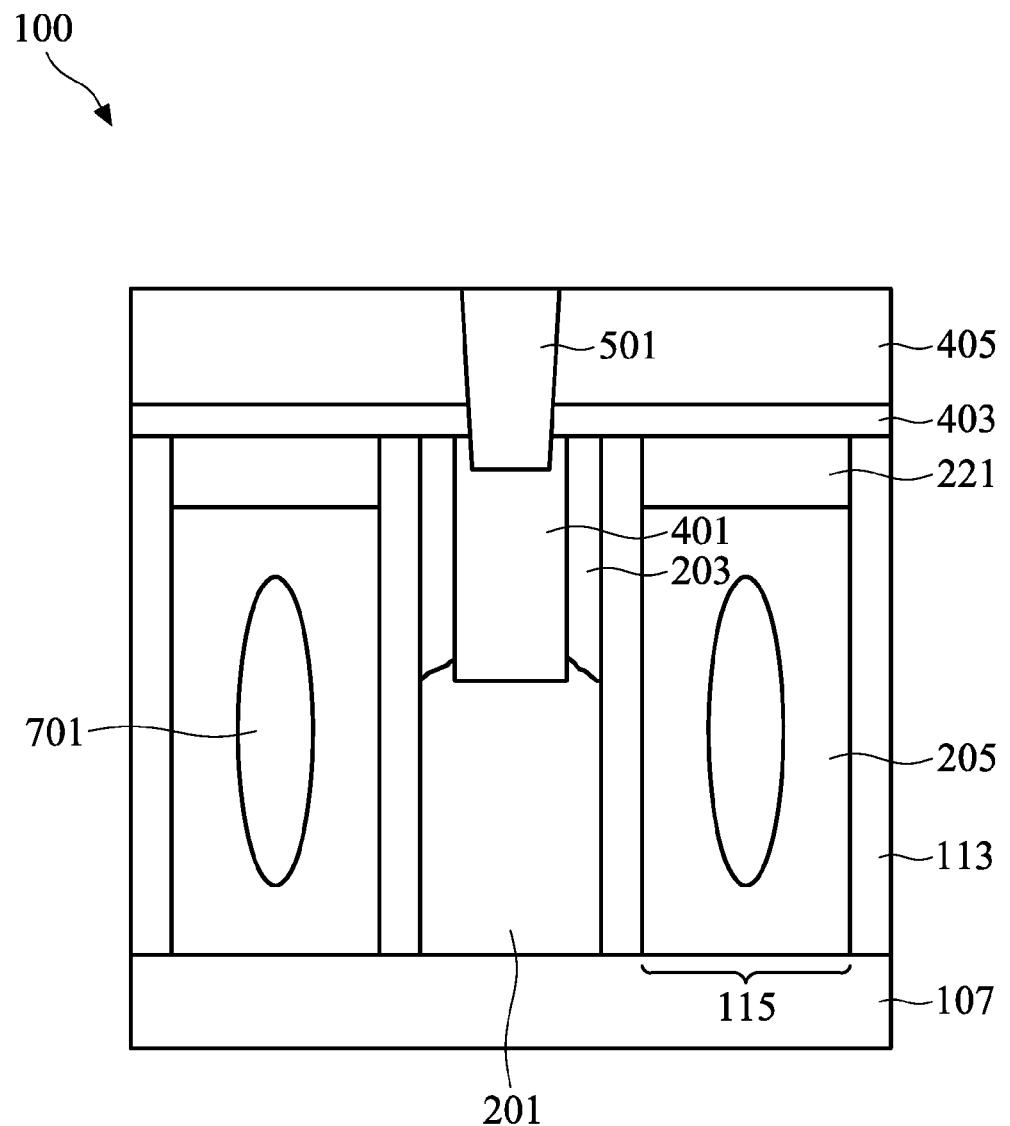

FIGS. 10A-10B illustrate embodiments in which the first contact 401 are formed with vertical or substantially vertical sidewalls. In this embodiment the first contact 401 may have a constant width, such as a sixth width $W_6$, of between about 5 nm and about 40 nm, such as about 20 nm. However, any suitable width may be utilized.

In order to form the sidewalls of the first contact 401 to be vertical or substantially vertical, the process conditions of the first etching process 303 (described above with respect to FIG. 3) may be tuned. In a particular embodiment, the bias and pressure of the first etching process 303 may be tuned to be a high bias and a low pressure. Such a high bias and low pressure will work to form the sidewalls of the first contact 401 to be vertical or substantially vertical. However, any suitable process for forming the sidewalls to be vertical may be utilized.

FIG. 10B illustrates an embodiment similar to the embodiment described above with respect to FIG. 10A. For example, the embodiment illustrated in FIG. 10B may include the first contact 401 having vertical or substantially vertical sidewalls. However, in this embodiment, the gate stacks 205 additionally include the seams 701 as discussed above with respect to FIGS. 7A-7C.

By forming the structures utilizing the embodiments described herein, a better process window and inline control may be achieved in finFET processes. This allows for a smaller gap and higher yield gain.

In a representative embodiment, a semiconductor device (e.g., a FinFET) comprises: a first conductive contact disposed over a substrate, the first conductive contact comprising an uppermost surface having a first lateral width; and a second conductive contact over the first conductive contact, the second conductive contact comprising a lower portion having a second lateral width, wherein the first lateral width is larger than the second lateral width. The first conductive contact is disposed laterally adjacent a gate structure, and the second conductive contact is disposed at a level above the gate structure. The semiconductor device may further comprise: a first conductive via extending to and contacting at least a portion of a top surface of the gate structure; and a second conductive via extending to and contacting at least a portion of a top surface of the second conductive contact. A bottommost portion of the second conductive via may be disposed at a level above a bottommost portion of the first conductive via. The semiconductor device may further comprise an etch stop layer (ESL) disposed at a level above the gate structure. The second conductive contact penetrates the ESL. The first conductive contact and the second conductive contact may have tapered sidewall profiles. The second conductive contact may have a bottommost surface disposed lower than an uppermost surface of the first conductive contact. The uppermost surface of the first conductive contact may protrude in a direction away from the substrate. A largest vertical height of the first conductive contact is larger than a vector projection of vertical distance of a sidewall of the first conductive contact. A distance between the bottommost surface of the second conductive contact and the uppermost surface of the first conductive contact may be less than about 1.0 nm. The semiconductor device may further comprise a silicide region interposed between a bottommost surface of the first conductive contact and a source/drain (S/D) region.

In another representative embodiment, a semiconductor device comprises a first insulating material disposed over a substrate, and a first conductive contact disposed in the first insulating material. The first conductive contact has a protruding uppermost surface, a first height along a centerline of the first conductive contact, and a second height along a vertical vector projection of a sidewall of the first conductive contact. The first height is larger than the second height. A second insulating material is disposed over the first insulating material, and a second conductive contact is in the second insulating material. The second conductive contact is disposed over and at least partially within the first conductive contact. The first conductive contact may be disposed laterally adjacent a fin field-effect transistor (FinFET) gate structure, and the second conductive contact may be disposed at a level above the FinFET gate structure. The semiconductor device may further comprise: a first conductive via extending to and contacting at least a portion of a top surface of the FinFET gate structure, and a second conductive via extending to and contacting at least a portion of a top surface of the second conductive contact. A bottommost portion of the second conductive via may be disposed at a level below the protruding uppermost surface of the first conductive via. The semiconductor device may further comprise an etch stop layer (ESL) disposed at a level above the FinFET gate structure. The second conductive contact penetrates the ESL. The first conductive contact and the second conductive contact have tapered sidewall profiles. A distance between a bottommost surface of the second conductive contact and the protruding uppermost surface of the first conductive contact may be less than about 1.0 nm.

In yet another representative embodiment, a method for manufacturing a semiconductor device (e.g., a FinFET) begins with a step of depositing a first insulating material over a substrate. A first conductive contact is formed in the first insulating material. The first conductive contact has a protruding uppermost surface. A first height along a centerline of the first conductive contact is larger than a second height along a vertical vector projection of a sidewall of the first conductive contact. A second insulating material is deposited over the first insulating material. A second conductive contact is formed in the second insulating material. The second conductive contact is disposed over and at least partially within the first conductive contact, with a distance between a bottommost surface of the second conductive contact and an uppermost surface of the first conductive contact being less than about 1.0 nm. The method may further comprise a step of growing an epitaxial region over the substrate before depositing the first insulating material. The method may further comprise a step of forming a silicide region interposed between the first conductive contact and the epitaxial region. The method may further comprise a step of forming an etch stop layer (ESL) disposed between the first insulating material and the second insulating material, with the second conductive contact penetrating a portion of the ESL overlying the first conductive contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a first conductive contact disposed over a substrate, the first conductive contact comprising an uppermost surface having a first lateral width;
    a second conductive contact over the first conductive contact, the second conductive contact comprising a lower portion having a second lateral width, wherein the first lateral width is larger than the second lateral width; and
    a void located within the gate structure.

2. The semiconductor device of claim 1, wherein the first conductive contact is disposed laterally adjacent a gate structure, and the second conductive contact is disposed at a level above the gate structure.

3. The semiconductor device of claim 2, further comprising an etch stop layer (ESL) disposed at a level above the gate structure, wherein the second conductive contact penetrates the ESL.

4. The semiconductor device of claim 1, wherein the first conductive contact and the second conductive contact have tapered sidewall profiles.

5. The semiconductor device of claim 1, wherein the second conductive contact has a bottommost surface disposed lower than an uppermost surface of the first conductive contact.

6. The semiconductor device of claim 5, wherein the uppermost surface of the first conductive contact protrudes in a direction away from the substrate.

7. The semiconductor device of claim 6, wherein a largest vertical height of the first conductive contact is larger than a vector projection of vertical distance of a sidewall of the first conductive contact.

8. The semiconductor device of claim 7, wherein a distance between the bottommost surface of the second conductive contact and the uppermost surface of the first conductive contact is less than about 1.0 nm.

9. The semiconductor device of claim 8, further comprising a silicide region interposed between a bottommost surface of the first conductive contact and a source/drain (S/D) region.

10. A semiconductor device comprising:
a first insulating material disposed over a substrate;
a first conductive contact disposed in the first insulating material, the first conductive contact comprising a protruding uppermost surface, the first conductive contact having a first height along a centerline of the first conductive contact, the first conductive contact having a second height along a vertical vector projection of a sidewall of the first conductive contact, wherein the first height is larger than the second height;
a second insulating material disposed over the first insulating material; and
a second conductive contact in the second insulating material, the second conductive contact disposed over and at least partially within the first conductive contact.

11. The semiconductor device of claim 10, wherein the first conductive contact is disposed laterally adjacent a fin field-effect transistor (FinFET) gate structure, and the second conductive contact is disposed at a level above the FinFET gate structure.

12. The semiconductor device of claim 11, further comprising a void located within the FinFET gate structure.

13. The semiconductor device of claim 11, further comprising an etch stop layer (ESL) disposed at a level above the FinFET gate structure, wherein the second conductive contact penetrates the ESL.

14. The semiconductor device of claim 10, wherein the first conductive contact and the second conductive contact have tapered sidewall profiles.

15. The semiconductor device of claim 10, wherein a distance between a bottommost surface of the second conductive contact and the protruding uppermost surface of the first conductive contact is less than about to 1.0 nm.

16. A method comprising:
depositing a first insulating material over a substrate;
forming a first conductive contact in the first insulating material, the first conductive contact comprising a protruding uppermost surface, the first conductive contact having a first height along a centerline of the first conductive contact, the first conductive contact having a second height along a vertical vector projection of a sidewall of the first conductive contact, wherein the first height is larger than the second height;
depositing a second insulating material over the first insulating material; and
forming a second conductive contact in the second insulating material, the second conductive contact disposed over and at least partially within the first conductive contact, wherein a distance between a bottommost surface of the second conductive contact and an uppermost surface of the first conductive contact is less than about to 1.0 nm.

17. The method of claim 16, further comprising growing an epitaxial region over the substrate before depositing the first insulating material.

18. The method of claim 17, further comprising forming a silicide region interposed between the first conductive contact and the epitaxial region.

19. The method of claim 16, further comprising forming an etch stop layer (ESL) disposed between the first insulating material and the second insulating material, wherein the second conductive contact penetrates a portion of the ESL overlying the first conductive contact.

20. The method of claim 16, wherein the first conductive contact is disposed laterally adjacent a fin field-effect transistor (FinFET) gate structure with a void located within the FinFET gate structure.

\* \* \* \* \*